United States Patent
Sammarco et al.

(10) Patent No.: US 12,050,788 B2
(45) Date of Patent: Jul. 30, 2024

(54) ACCELERATED COOLING IN STORAGE DEVICES

(71) Applicant: Western Digital Technologies, Inc., San Jose, CA (US)

(72) Inventors: Cono J Sammarco, San Jose, CA (US); Gurjit Chadha, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 246 days.

(21) Appl. No.: 17/746,571

(22) Filed: May 17, 2022

(65) Prior Publication Data

US 2023/0376221 A1    Nov. 23, 2023

(51) Int. Cl.
| | |
|---|---|
| G06F 1/20 | (2006.01) |
| G06F 3/06 | (2006.01) |
| G11B 33/14 | (2006.01) |
| H01L 23/38 | (2006.01) |

(52) U.S. Cl.
CPC .......... G06F 3/0625 (2013.01); G06F 1/206 (2013.01); G06F 3/0653 (2013.01); G06F 3/0659 (2013.01); G06F 3/0673 (2013.01); G11B 33/144 (2013.01); H01L 23/38 (2013.01)

(58) Field of Classification Search
CPC ......... H01L 23/38; G06F 1/206; G06F 3/0625
See application file for complete search history.

(56) References Cited

U.S. PATENT DOCUMENTS

| | | | | |
|---|---|---|---|---|
| 4,631,728 A * | 12/1986 | Simons | ............... | H01S 5/02415 372/34 |
| 6,253,556 B1 * | 7/2001 | Schendel | ................ | F25B 21/04 257/E23.081 |
| 6,679,064 B2 * | 1/2004 | Chang | ..................... | F25B 21/04 136/201 |
| 7,297,894 B1 * | 11/2007 | Tsukamoto | ....... | H01L 21/67109 118/724 |
| 7,528,502 B2 * | 5/2009 | Maeda | ..................... | H02J 7/345 307/46 |
| 7,544,883 B2 * | 6/2009 | Chen | ...................... | H10N 19/00 136/224 |

(Continued)

FOREIGN PATENT DOCUMENTS

JP    2004361553 A    * 12/2004

*Primary Examiner* — Robert J Hoffberg
(74) *Attorney, Agent, or Firm* — Ravi Mohan; Rutan & Tucker, LLP

(57) ABSTRACT

Various devices, such as storage devices or storage systems are configured to recycle heat generated during normal operation. This recycled heat can be captured and converted into electricity that can be stored for later discharge and use in cooling the storage devices. The recycling can be done through a variety of energy recycling modules that can be placed on various components within a storage device. These energy recycling modules can be a series of semiconductors that utilize various natural effects to convert heat applied on one side of the module into electricity that can be delivered to various power storing components or used in other areas of the storage device or system. These energy recycling modules can include versions that act as a cooler that can work to accelerate cooling of the storage device upon completion of a period of high usage, thereby reducing cooling costs and increasing device lifespans.

20 Claims, 10 Drawing Sheets

(56) References Cited

U.S. PATENT DOCUMENTS

| | | | | |
|---|---|---|---|---|
| 7,952,049 | B2* | 5/2011 | Tsukamoto | H01L 21/67103 219/486 |
| 8,129,609 | B2* | 3/2012 | Chen | H10N 10/01 136/224 |
| 9,183,000 | B2 | 11/2015 | Ichida et al. | |
| 9,190,595 | B2* | 11/2015 | Chung | H10N 10/17 |
| 9,228,763 | B2* | 1/2016 | Kim | H10N 10/17 |
| 9,423,161 | B2* | 8/2016 | Ludwig | H10N 10/10 |
| 9,746,889 | B2* | 8/2017 | Mittal | H10N 19/00 |
| 9,799,816 | B2* | 10/2017 | Chung | H01L 24/49 |
| 10,193,371 | B2* | 1/2019 | Chiang | H10N 10/853 |
| 11,169,583 | B2 | 11/2021 | Karalnik et al. | |
| 11,444,001 | B1* | 9/2022 | Du | H01L 23/38 |
| 11,765,862 | B2* | 9/2023 | Yang | H02M 3/1582 361/704 |
| 2002/0121094 | A1* | 9/2002 | VanHoudt | H01S 5/02415 62/3.3 |
| 2008/0229759 | A1 | 9/2008 | Ouyang et al. | |
| 2009/0151765 | A1* | 6/2009 | Han | H10N 10/13 136/207 |
| 2009/0283124 | A1* | 11/2009 | Seo | H10N 10/00 136/201 |
| 2009/0283125 | A1* | 11/2009 | Seo | H02J 7/32 136/201 |
| 2011/0128727 | A1 | 6/2011 | Kochupurackal et al. | |
| 2012/0038175 | A1* | 2/2012 | Tang | H05K 7/20136 290/1 R |
| 2014/0252531 | A1* | 9/2014 | Aryan | H10N 19/00 257/467 |
| 2021/0026425 | A1 | 1/2021 | Spica | |
| 2021/0351103 | A1 | 11/2021 | Lee et al. | |
| 2023/0376087 | A1* | 11/2023 | Sammarco | G06F 1/20 |
| 2023/0376382 | A1* | 11/2023 | Sammarco | G06F 1/263 |

* cited by examiner

ACCELERATED COOLING IN STORAGE DEVICES

FIELD

The present disclosure relates to storage systems. More particularly, the present disclosure relates to utilizing various energy recycling devices to recycle energy and provide cooling to various components within the storage device.

BACKGROUND

Storage devices are ubiquitous within computing systems. Recently, solid-state storage devices (SSDs) have become increasingly common. These nonvolatile storage devices can communicate and utilize various protocols including nonvolatile memory express (NVMe), and peripheral component interconnect express (PCIe) to reduce processing overhead and increase efficiency.

As they have evolved, SSDs have become more power efficient compared to traditional hard disk drives (HDDs), hence giving SSDs an advantage in consumer and commercial markets. During usage, a typical SSD will become very hot to the touch due to energy loss within the drive. Almost all electrical circuits will suffer from power loss due to heat dissipation. This occurs whenever the circuit is on and receiving electrical energy. In various deployments, especially in large, commercial data centers, this heat dissipation incurs additional costs to provide cooling.

BRIEF DESCRIPTION OF DRAWINGS

The above, and other, aspects, features, and advantages of several embodiments of the present disclosure will be more apparent from the following description as presented in conjunction with the following several figures of the drawings.

Figure 1:
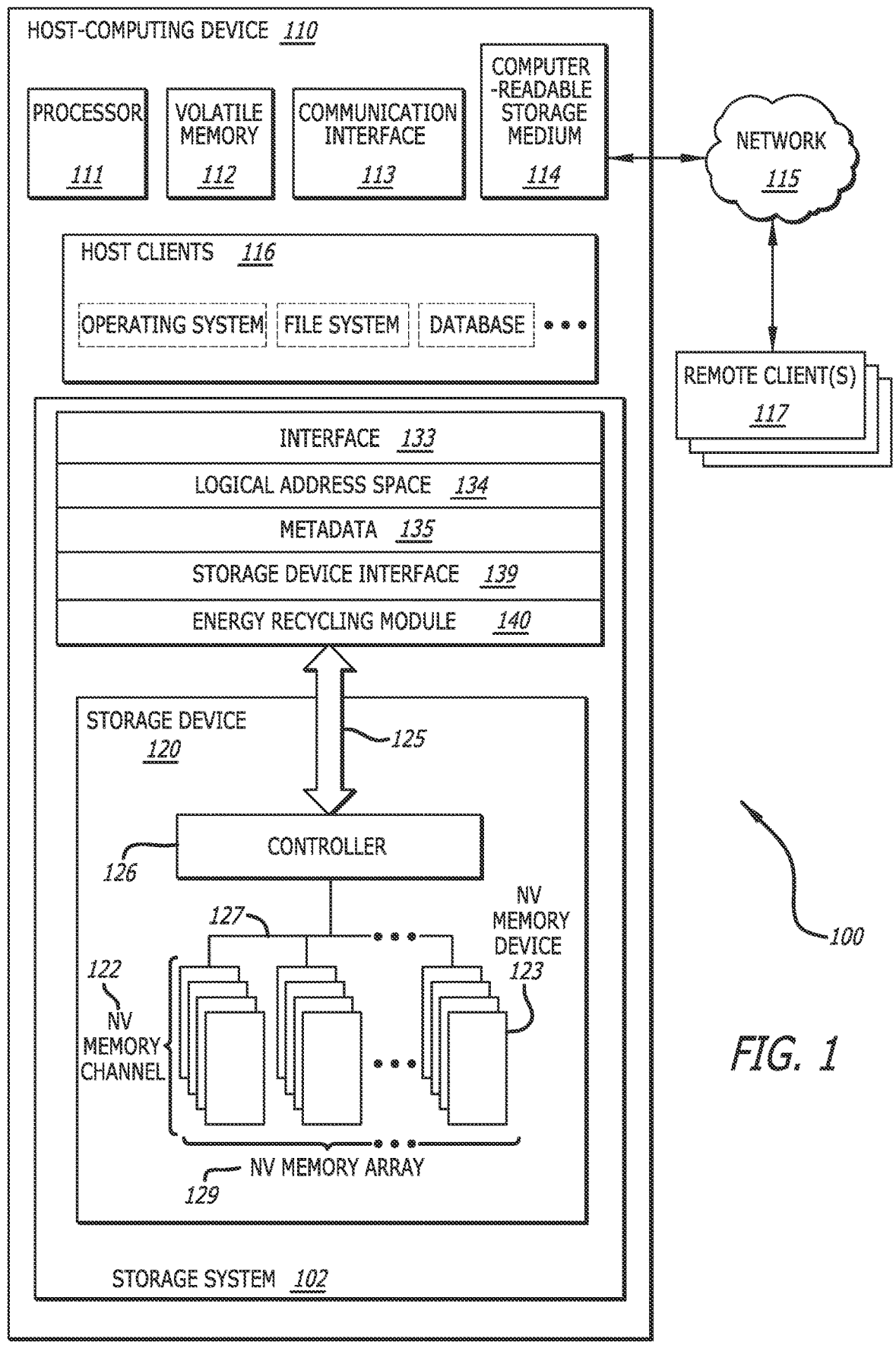
FIG. 1 is a schematic block diagram of a host-computing device with a storage system suitable for accelerated cooling in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that can utilize recycled heat generated from various components within a storage device to accelerate cooling of the device. The cooling can be accomplished by recycling which can be done to generate electricity that can be stored in one or more power storage components. Furthermore, energy recycling modules can be configured into a capture mode that captures the generated heat from a storage device and convert it to electricity. More importantly, however, is that these modules can also be configured to provide active cooling to various components as needed. This cooling mode can be achieved once a supply of power has been given to the energy recycling module. In some embodiments, a single energy recycling module can be configured between capture and cooling modes. In further embodiments, the storage device may include multiple energy recycling modules wherein a first module is configured in capture mode and a second module is configured in cooling mode such that it is powered by energy captured from the first module.

In a number of embodiments, the amount of energy recycling modules can vary depending on the application desired. For example, in certain storage devices, the processor generates the most heat relative to other storage device components. In these embodiments, the energy recycling module may be disposed onto the processor and be configured in capture mode. When the processor undergoes increased usage, the heat increases and is recycled at least in part. When the increased usage subsides, the energy recycling module may be configured into a cooling mode that help cool the processor back down. In still further embodiments, the power generated in a capture mode can be stored for later use by one or more components within the storage device, including the energy recycling module itself.

These configurations can vary greatly depending on the components within the storage device, the type of energy recycling module utilized, or whether the storage device is part of a storage system. For example, a storage system may include a plurality of storage devices that each have energy recycling modules configured to capture heat and generate recycling electricity. This generated electricity may be delivered externally of the storage device and/or storage system. The stored energy may be utilized to power other components, to perform additional operations, to cool various storage devices, and the like.

In various embodiments, the storage device may monitor various operations being performed. As operations within the storage device increase, so does the excess heat generated. Often, storage devices undergo periods or cycles of high usage and low usage. During high usage, more operations are typically performed. Low usage may occur when the operations being performed drops below a predetermined threshold or when the storage device is idle and not performing any operations. In a number of embodiments, at least one energy recycling module can be configured in a cooling mode and receive stored electricity to cool one or more components within the storage device. This cooling can be done during low usage portions of the overall usage cycle, or when the operations fall below a particular predetermined threshold. Often, the electricity needed to operate the energy recycling module(s) in cooling mode is received from a power-storing component that stored previously recycled electricity. In some embodiments, the storage device can be configured with multiple energy recycling modules which can operate in either a capture and/or cooling mode. In still further embodiments, the cooling may be done in response to a thermal limit or threshold exceeded as sensed by a temperature sensor within the storage device, storage system, or other host-computing device.

These solutions can help reduce costs associated with operating storage devices, such as in datacenters which utilize a large number of drives that are constantly undergoing reading and writing operations, which creates a steady stream of heat that is dissipated and lost, requiring cooling from the datacenter operators. As the scale of datacenters and the number of storage devices in use increases, even small amounts of energy recycling can have a dramatic impact on the environment via reduced power and cooling needs. Certain configurations may also be able to increase efficiency and lower power requirements, thus increasing the value presented to customers of the storage device manufacturers.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for accelerated cooling in accordance with an embodiment of the disclosure is shown. The energy recycling and cooling system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network 115, such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a communication network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer-readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote clients 117 accessible via the network 115 and/or communication interface 113. The host clients 116 may include, but are not limited to: operating systems, file systems, database applications, server applications, kernel-level processes, user-level processes, applications, and the like.

In many embodiments, the host-computing device 110 can include a plurality of virtual machines which may be instantiated or otherwise created based on user-request. As will be understood by those skilled in the art, a host-computing device 110 may create a plurality of virtual machines configured as virtual hosts which is limited only on the available computing resources and/or demand. A hypervisor can be available to create, run, and otherwise manage the plurality of virtual machines. Each virtual machine may include a plurality of virtual host clients similar to host clients 116 that may utilize the storage system 102 to store and access data.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote clients 117 (which can act as another host). The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

The storage system 102 may also include an energy recycling module 140. In various embodiments, the energy recycling module 140 may be disposed within a storage system, such as the embodiment depicted in FIG. 1. However, it is contemplated that many embodiments comprise at least one energy recycling module 140 disposed within the storage device 120 itself. As described in further detail below, the energy recycling module can be configured to capture excess heat and generate electricity that can be stored or utilized to power other components within the storage device 120 and/or storage system 102. The energy recycling module 140 may also be configured to operate in a cooling mode that can receive a power supply and cool one or more surfaces of various components within the storage device 120 or storage system 102. It should also be noted that the energy recycling module 140 may be similar to the energy recycling modules discussed throughout this disclosure such as those described in FIGS. 2-10.

Figure 2:
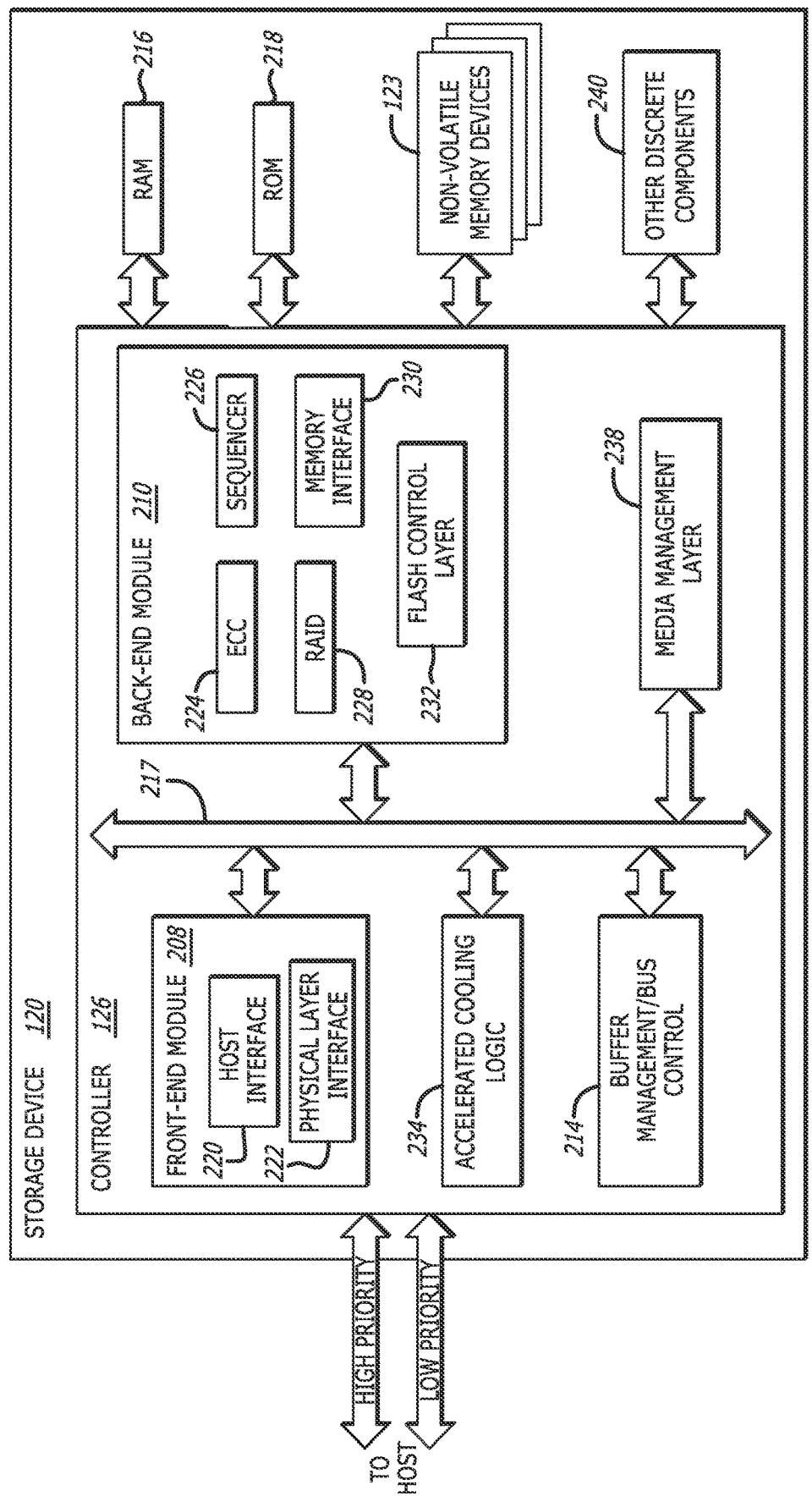
FIG. 2 is a schematic block diagram of a storage device suitable for accelerated cooling in accordance with an embodiment of the disclosure.

Referring to FIG. 2, a schematic block diagram of a storage device 120 suitable for energy recycling and cooling in accordance with an embodiment of the disclosure. The controller 126 may include a front-end module 208 that interfaces with a host via a plurality of high priority and low priority communication channels, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as energy recycling modules, external electrical interfaces, external RAM, resistors, capacitors, or other components that may interface with controller 126. In alternative embodiments, one or more of the RAID modules 228, media management layer 238 and buffer management/bus control module 214 are optional components that may not be necessary in the controller 126.

Finally, the controller 126 may also comprise an accelerated cooling logic 234. In many embodiments, the accelerated cooling logic 234 can be configured to enable a plurality of energy recycling modules within the storage device 120 to capture heat generated from one or more components. Once converted to electricity by the energy recycling modules, the accelerated cooling logic 234 can direct that electricity to be stored in one or more power-storing components, such as, but not limited to, a capacitor or battery. During normal operation of the device, the accelerated cooling logic 234 can monitor various operations being performed. In some embodiments, this monitoring can be done via the controller. In further embodiments, the monitoring can be done by examining the rate or type of messages being received by a host-computing device. In still additional embodiments, the monitoring can be accomplished through a temperature sensor signal exceeding a predetermined threshold.

In response to a thermal event occurring, the accelerated cooling logic 234 can be configured to direct one or more energy recycling modules to operate in a cooling mode and accelerate the cooling of one or more components within the storage device. The accelerated cooling logic 234 may do this by utilizing the recycled electricity stored in the one or more power storing components. However, it is contemplated that this is not necessary and the energy recycling modules can be fed power from a standard power line within the storage device. The actions of the accelerated cooling logic 234 can be carried out by generating various signals, such as when it is determined that the current operations occurring within the storage device have fallen below a predetermined threshold. This predetermined threshold may be set during the time of manufacture, or can be indicated by a host-computing device or internal controller based on various information such as readings from a temperature sensor or messages received from a host-computing device.

Figure 3:
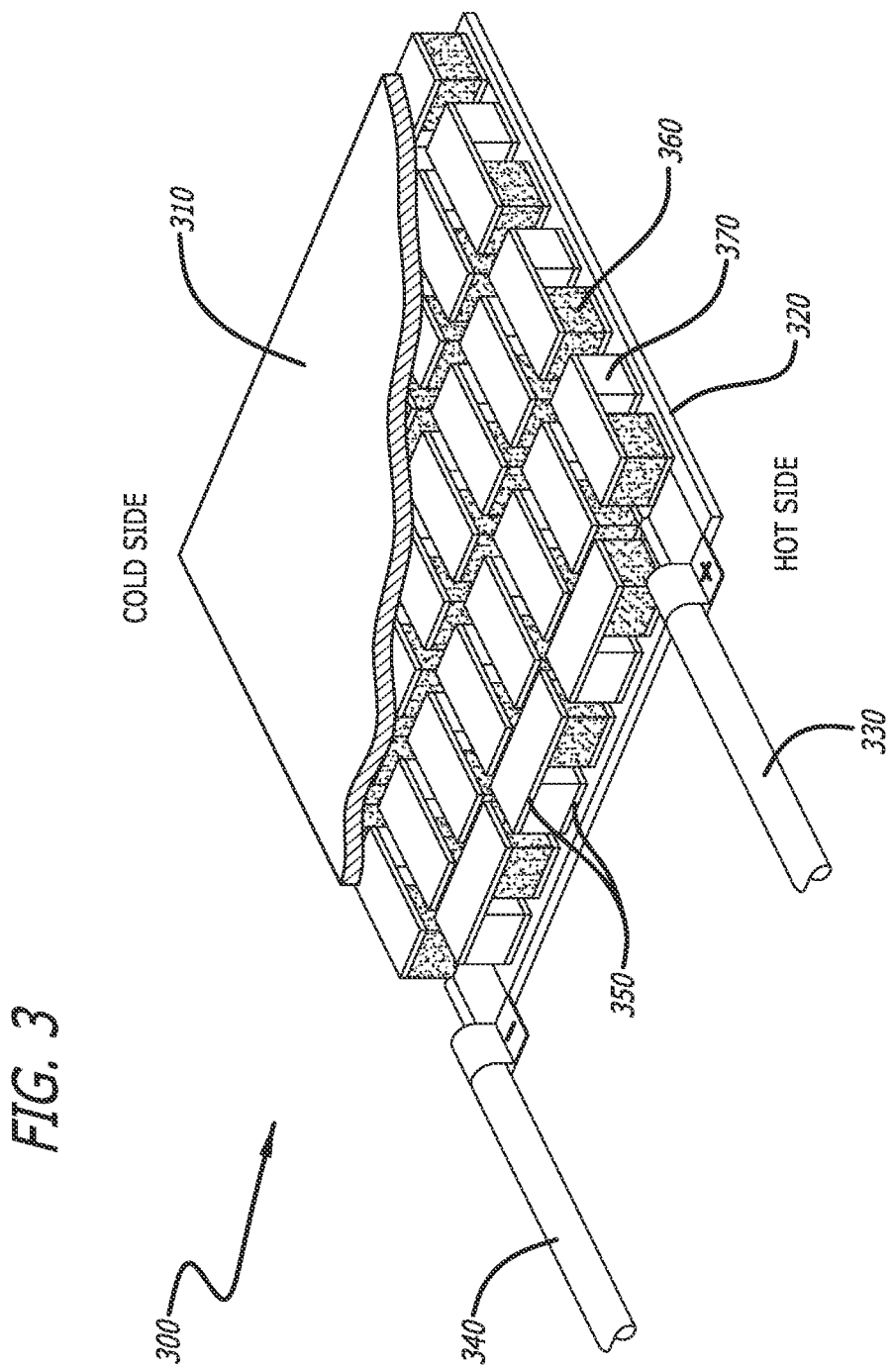
FIG. 3 is a block diagram of an energy recycling module in accordance with an embodiment of the disclosure.

Referring to FIG. 3, a block diagram of an energy recycling module 300 in accordance with an embodiment of the disclosure is shown. In many embodiments, the energy recycling module 300 can be configured with a hot side plate 320 and a cold side plate 310 on opposing sides. Additionally, the energy recycling module 300 can comprise a positive electrical terminal 330 and a negative electrical terminal 340 which can allow for transfer of electricity into and out of the energy recycling module 300. For example, the energy recycling module 300 can be configured as a thermo-electric generator ("TEG") that can capture excess heat received on the hot side plate 320 and generate electricity that can be delivered over the positive and negative electrical terminals 330, 340. As discussed below, the delivered electricity can be stored in another component of a storage device and/or system for later utilization.

This generation of electricity from the capturing of excess heat from within the storage device can be realized through a number of methods. In various embodiments, the energy recycling module 300 can utilize a thermoelectric effect such as the Seebeck effect to generate electricity. As those skilled in the art will recognize, the Seebeck effect describes that when a difference in temperature exists across a conductor and/or semiconductor, then a voltage difference is created. This voltage difference can then be captured by one or more components, such as but not limited to, a capacitor for later utilization or discharge. In the embodiment depicted in FIG. 3, the energy recycling module 300 comprises a series of n-type semiconductors 360 and p-type semiconductors 370. Each of these pairs are in thermal connection with a pair of conductors 350 that allow for electric conduction.

In another example, the energy recycling module 300 can be configured as a thermo-electric cooler ("TEC"). In this configuration, the energy recycling module 300 can receive power (typically through connection to a voltage source) through the positive electrical terminal 330 and negative electrical terminal 340 and utilize that power to cool the hot side plate 320 and/or the cold side plate 310. Similar to TEG-configured energy recycling modules 300, the ability to cool one or more components within a storage device can be realized through a number of methods. In a number of embodiments, the energy recycling module 300 can utilize a thermoelectric effect such as the Peltier effect to utilize electricity to cool various components. As those skilled in the art will recognize, the Peltier effect describes that when a voltage is applied across doped semiconductors, one side will rapidly cool, and the other side would collect displaced heat. The series of n-type semiconductors 360 and p-type semiconductors 370 shown in the embodiment of FIG. 3 can be configured as doped semiconductors. The cooling side can also be configured based on the direction/polarity of current being provided to the energy recycling module 300.

In some embodiments, the energy recycling module 300 can be configured to be either a TEC or a TEG type module. However, it would be understood by those skilled in the art that such energy recycling modules 300 can often be configured to operate as both a TEC and a TEG. Often though, in order to maximize efficiency within the energy recycling modules 300, each is selected to perform one function or the other. It should also be noted that the energy recycling module 300 may be similar to the energy recycling modules discussed throughout this disclosure such as those described in FIGS. 1 and 4-10.

Figure 4:
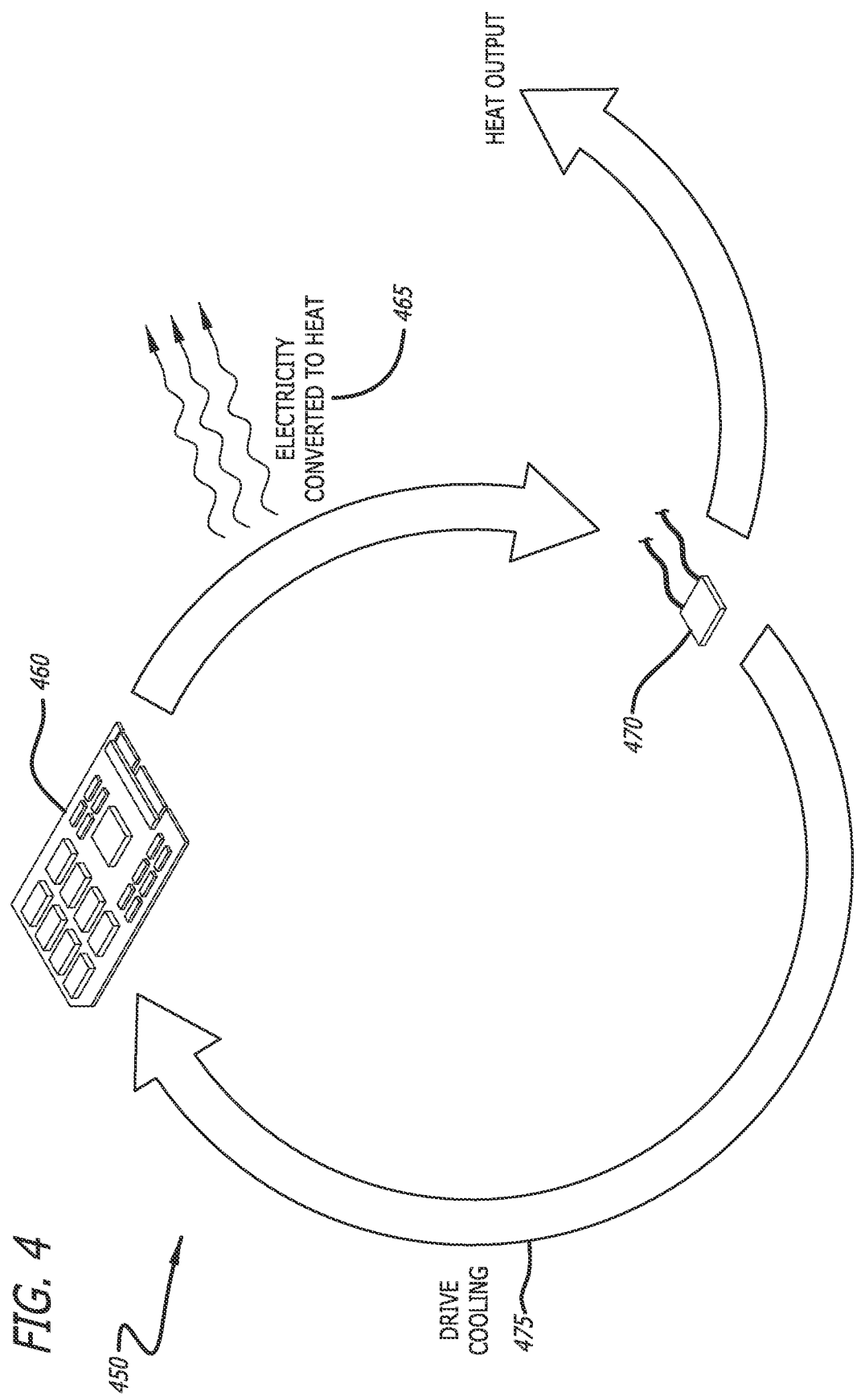
FIG. 4 is a flowchart depicting a process for cooling a storage device via heat captured from the storage device in accordance with an embodiment of the disclosure.

Referring to FIG. 4, a flowchart depicting a process 450 for cooling a storage device 460 via heat captured from the storage device in accordance with an embodiment of the disclosure is shown. As discussed above, a process 450 for utilizing an energy recycling module 470 as a TEC can occur within a storage device 420. In many embodiments, the process 450 can start when the storage device 460 is powered and operating normally. Often, during various points of use, the storage device 460 can process an increased number of operations, which may include read, write, or other commands. During this and other operating times, the storage device can generate excess heat (arrow 465). This heat is typically lost to the ambient environment and subsequently heats up the various components within the storage device as well as other components within the host-computing device or storage system.

However, in a number of embodiments, an energy recycling module 470 can be disposed upon one or more components of the storage device to drive or accelerate cooling (arrow 475). As discussed in more detail below, the energy recycling module 470 can be thermally coupled to the storage device 460 via placement over one or more components that are likely to generate or suffer from excess heat. In many embodiments, the energy recycling module will be disposed such that a first side will be coupled to the storage device 460 that will generate a relatively cooler surface against the one or more components. In some embodiments, the opposite surface can be configured to expel or dissipate heat to the outside of the storage device 460, for example, when the storage device 460 has a casing that encloses the various operating components of the storage device 460. In this way, the energy recycling module 470 will receive electricity from one or more power sources to generate a cooling surface against various components within the storage device 460. The energy recycling module can thus be configured to lower the overall operating and/or ambient temperature of the components of the storage device 460. It should also be noted that the energy recycling module 470 and the storage device 460 may be similar to the energy recycling modules and/or storage devices discussed throughout this disclosure such as those described in FIGS. 1-3 and 5-10.

Figure 5:
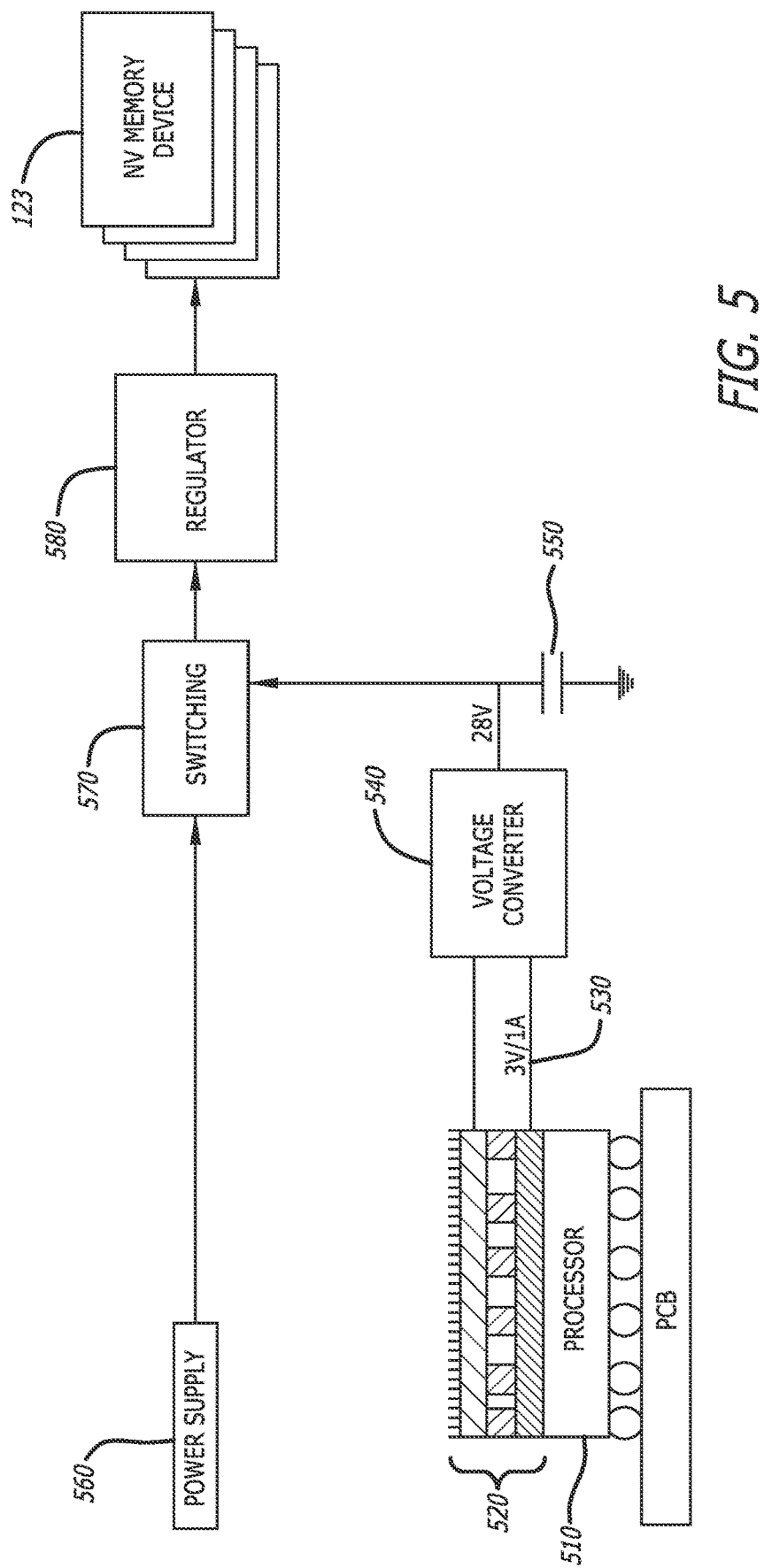
FIG. 5 is a block diagram depicting an energy recycling module configuration within a storage device in accordance with an embodiment of the disclosure.

Referring to FIG. 5, a block diagram depicting an energy recycling module configuration within a storage device in accordance with an embodiment of the disclosure is shown. As previously discussed, an energy recycling module 520 can be disposed on one or more components of the storage device, which can include a processor 510 which is attached to a PCB board within the storage device. There are a number of different energy recycling modules 520 and energy storage solutions available to carry out various embodiments of this disclosure. In certain embodiments, the voltage generated by the energy recycling module 520 may require adjustment prior to storage and/or utilization. For example, in the embodiment depicted in FIG. 5, the energy generated by the energy recycling module 520 is configured to be stored within a capacitor 550. However, the capacitor operates efficiently when provided a higher voltage than is generated by the energy recycling module 520. In order to facilitate proper use and storage of the recycled energy, the use of a voltage converter 540 may be required to convert a first voltage provided via one or more electrical lines 530 from an energy recycling module 520 to a second voltage that is compatible with the capacitor 550 utilized for storage. In some embodiments, the voltage converter may be a buck boost-type converter.

The storage device is often configured with an input from one or more power supplies 560. The various non-volatile memory devices 123 require power to operate and often receive the necessary electricity from the power supply 560. However, in various embodiments, the storage device can be configured to allow the non-volatile memory devices 123 to operate via power provided by the energy recycling module 520, which, in the embodiment depicted in FIG. 5, is discharged from a capacitor 550. In these embodiments, a switching component 570 may be required to determine what power source to utilize. The switching component 570 may determine this by examining current operating conditions such as current draw, available power, stored power amount, and/or ambient temperature, etc. The power provided by the capacitor 550 and/or power supply 560 may require regulation and/or adjustments prior to use by the non-volatile memory devices 123. In these embodiments, a regulator component 580 may be utilized. In this way, the non-volatile memory devices 123 can operate with the necessary power, regardless of which source provided said power. It should also be noted that the energy recycling module 520 may be similar to the energy recycling modules discussed throughout this disclosure such as those described in FIGS. 1-4B and 6-10.

Figure 6:
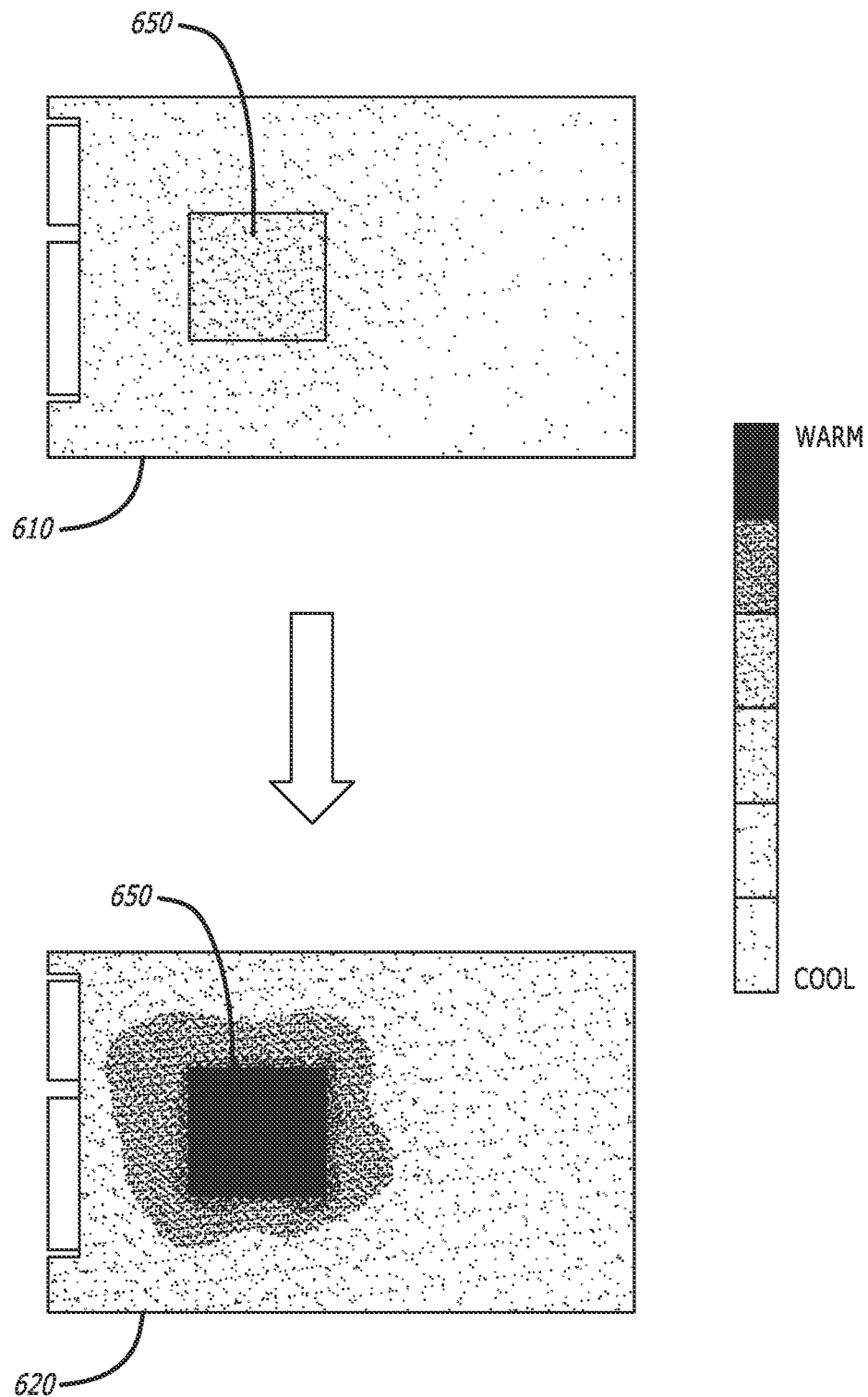
FIG. 6 is a conceptual illustration of a storage device increase in heat output during operations in accordance with an embodiment of the disclosure.

Referring to FIG. 6, a conceptual illustration of a storage device increase in heat output during operations in accordance with an embodiment of the disclosure is shown. As previously described, various components of a storage device can become hotter under increased use. The idle storage device 610 depicted in FIG. 6 depicts a conceptual heatmap of the device when resting and not in use. The processor 650 generates some heat, which spreads out into the adjacent areas of the idle storage device 610. Even though the idle storage device 610 may not be processing any received commands from a host-computing device, the components within the idle storage device 610 still require a minimum amount of power to operate and be prepared to respond to received commands.

Upon processing of a series of received commands from a host-computing device, the various components increase in heat output, as seen in the high-load storage device 620. As those skilled in the art will know, the idle storage device 610 can become a high-load storage device 620 upon receiving a string of commands to process. The processing of these commands require electricity, some of which is lost as waste heat. This wasted heat is often focused on the area demanding the most electricity to process requests, the processor 650. As seen in the embodiment depicted in FIG. 6, the high-load storage device 620 has a processor 650 that is generating a lot of heat directly on the surface of the processor itself. The heat being generated is also bleeding out into other components of the high-load storage device 620. Thus, in many embodiments, the placement of the energy recycling module is on the surface of the processor 650.

The sensing of this change in temperature can be done through one or more temperature sensors disposed within the high-load storage device 620 or via an external temperature sensor that is communicatively coupled to the high-load storage device 620. In certain embodiments, the overall temperature can be measured in a plurality of zones throughout the high-load storage device 620. For example, the average temperature of the storage device can be determined by averaging the temperature of one area or zone of the storage device and a second area or zone. It should also be noted that the storage devices 610, 620 may be similar to the storage devices discussed throughout this disclosure such as those described in FIGS. 1-5 and 7-10.

Figure 7:
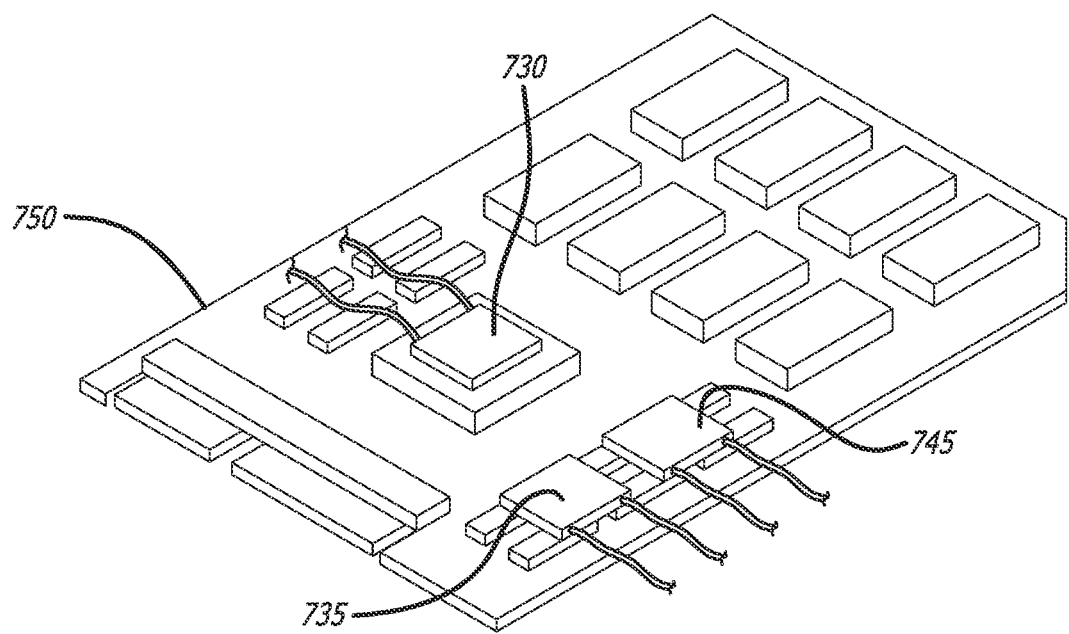
FIG. 7 is a conceptual illustration of a storage device with a plurality of energy recycling modules disposed on multiple components in accordance with an embodiment of the disclosure.

Referring to FIG. 7, a conceptual illustration of a storage device 750 with a plurality of energy recycling modules 730, 735, 745 disposed on multiple components in accordance with an embodiment of the disclosure is shown. In various embodiments, a storage device 750 can be configured with a first energy recycling module 730 disposed on a processor and a second energy recycling module 735 disposed on a controller and a third energy recycling module 745 disposed on at least a portion of the memory array. Those skilled in the art will recognize that the embodiment depicted in FIG. 7 may comprise various components, chips, etc. that have different functions. It is contemplated that a storage device 750 may vary greatly depending on the components utilized and the application desired. The embodiment in FIG. 7 is utilized for conceptual illustration purposes only.

In some embodiments, the storage device 750 may include energy recycling modules that operate in a fixed mode. In these embodiments, a first energy recycling module 730 may be configured in a capture mode only, while the second energy recycling module 735 and third energy recycling module 745 are configured in a cooling mode only. In this way, power captured and recycled from the first energy recycling module 730 can be utilized to power to the second and third energy recycling modules 735, 745. It is contemplated that a variety of combinations of energy recycling modules, locations, and configurations may be realized based on the desired application.

In more embodiments, storage devices 750 can be manufactured and sold in a variety of configurations. In various embodiments, a storage device 750 can include at least a casing enclosing the various components required to operate a storage device. In certain of these embodiments, the casing may be configured to allow for the first energy recycling module 730 to extend outside of the casing. In these configurations, the first energy recycling module 730 may allow for the cooling of internal components of a storage device while expelling heat away from the storage device. In one embodiment, one side of the first energy recycling module 730 can extend through a casing via an opening that is configured to provide sufficient clearance based on the first energy recycling module 730 desired. In this way, the opening may be different based on the placement and selection of various energy recycling modules. For example, the storage device may include multiple energy recycling modules. For example, one module may be configured as a TEG while another is configured as a TEC.

In further embodiments, the first energy recycling module 730 may be configured or shaped to cover a variety of different components within the storage device. In this way, the opening may be subsequently shaped to allow for this module, or the first energy recycling module 730 may be configured to gather and vent the heat from the storage device through a single surface. In additional embodiments, the vent surface may further be configured to couple with a secondary energy recycling module that can be configured for use within a storage system over multiple storage devices, like those described above with reference to FIG. 1.

In additional embodiments, the first energy recycling module 730 may be configured to reside completely within a casing and disposed directly onto one or more components such as a processor as seen in the embodiment depicted in FIG. 7. As technology regarding energy recycling modules evolves, it is contemplated that various modules may be placed on a plurality of components of the storage device 750. As such, once encased, the storage device 750 will not appear any different from non-accelerated cooling models available. These configurations can provide for reduced manufacturing costs and increased compatibility, especially with previously deployed or legacy devices. It should also be noted that the first energy recycling module 730 and the storage device 750 may be similar to the energy recycling modules and/or storage devices discussed throughout this disclosure such as those described in FIGS. 1-6 and 8-10.

Figure 8:
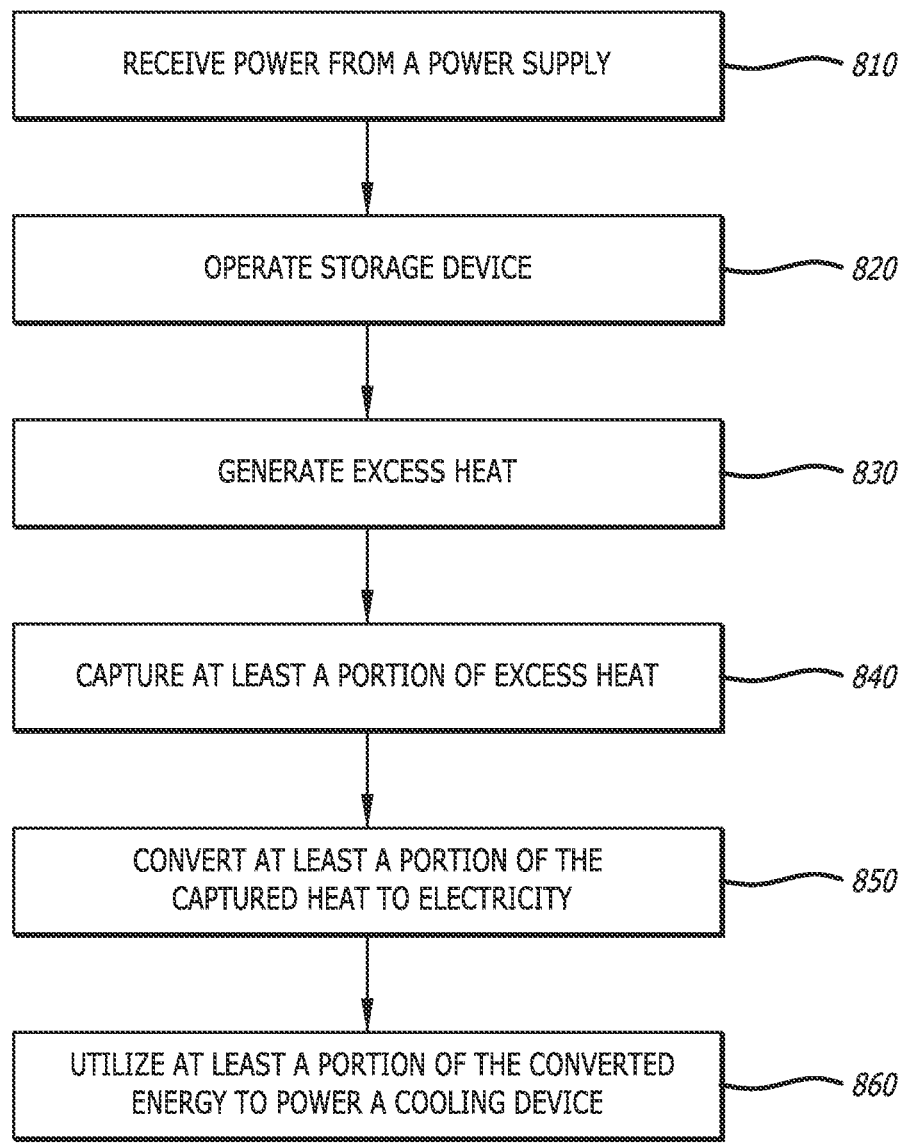
FIG. 8. is a flowchart depicting a process for storage device energy recycling in accordance with an embodiment of the disclosure.

Referring to FIG. 8, a flowchart depicting a process 800 for storage device energy recycling in accordance with an embodiment of the disclosure is shown. In many embodiments, the process 800 can begin when a storage device receives power form a power supply (block 810). As discussed above, the storage device is typically installed or deployed within a storage system or other host-computing device that has at least one power supply unit that is electrically connected to the storage device and provides a useable supply of power for operating the storage device. Once power is received, the storage device may be operated normally (block 820).

During operation, and especially under periods of high use, the storage device can generate excess heat (block 830). This heat is dissipated from the surface of various components within the storage device. In a variety of embodiments, the process 800 will capture at least a portion of this generated heat (block 840). Often, the capturing is done via one or more energy recycling modules that are disposed on a plurality of components. In a number of embodiments, the energy recycling modules are placed on components that are known to generate the most heat under use.

In additional embodiments, the process 800 can convert at least a portion of the captured heat to electricity (block 850). This converting can often be done through the use of energy recycling modules, such as a TEG. In further embodiments, the converted electricity is stored within one or more electrical storage devices, such as a capacitor within the storage device, although this is not required. However, the process 800 can be configured to utilize at least a portion of the converted energy to power a cooling device (block 860). As previously discussed, many embodiments may utilize an energy recycling module as the cooling device. In other embodiments, the utilized power is received from a power storage component and/or device that has stored previously converted electricity.

Figure 9:
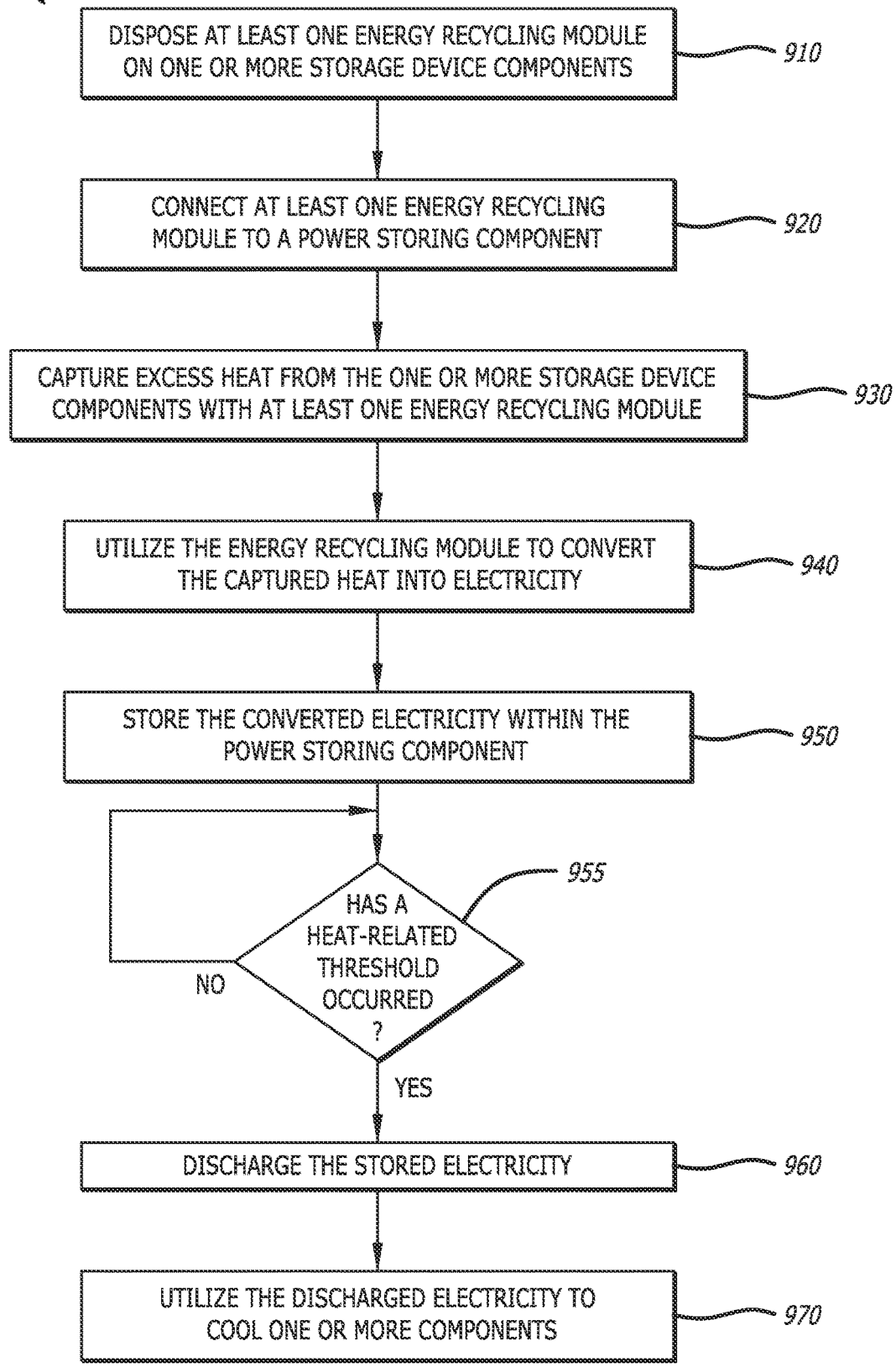
FIG. 9 is a flowchart depicting a process for utilizing stored electricity captured from an energy recycling module to cool components in accordance with an embodiment of the disclosure.

Referring to FIG. 9, a flowchart depicting a process 900 for utilizing stored electricity captured from an energy recycling module to cool components in accordance with an embodiment of the disclosure is shown. In a variety of embodiments, at least one energy recycling module can be disposed on one or more storage device components (block 910). As discussed above, the processor or similar components may be more likely to generate excess heat so may be candidates for disposing one or more energy recycling modules onto. Upon disposing the one or more energy recycling modules, they may be electrically connected to a plurality of power storing components (block 920). In many embodiments, the energy recycling modules will include at least a positive and negative power coupling that can be utilized to electrically connect with various power storing components. As discussed above, certain embodiments may utilize a capacitor as a power storing component, however, it is contemplated that other components may be utilized as needed based on the desired application.

During operation of the storage device, and especially under periods of high use, the storage device can generate excess heat. This heat is dissipated from the surface of various components within the storage device. As described above, certain components may generate more heat than others such as processors and/or controllers which may generate orders of magnitude more heat than surrounding components. In further embodiments, the heat generation may be across multiple locations or even multiple devices as part of a storage system. In such embodiments, the process 900 can capture at least a portion of this generated heat via at least one energy recycling module (block 930).

In additional embodiments, the process 900 can convert at least a portion of the captured heat to electricity (block 940). This converting can often be done through the use of energy recycling modules, such as, but not limited to, a TEG. In further embodiments, the converted electricity is stored within one or more power storing components (block 950). These power storing components may often be located within the same storage device but, in certain embodiments may be located elsewhere within a storage system. The power storing components may be configured to store the power until needed, such as in response to a heat-related event.

The process 900 can continuously monitor for any heat-related events and determine if they occur (block 955). In a number of embodiments, heat-related events can include a sudden increase in temperature, a sustained exceeding of a predetermined temperature, reception of a message related to temperature, or a sudden drop in sustained operations within the storage device, etc. When no heat-related event is detected, the process 900 can continue to detect for future events. When a heat-related event has occurred, the process 900 can discharge the stored electricity (block 960). In many embodiments, the stored electricity is discharged from the power storing components. Once discharged, one or more storage device components can utilize the discharged electricity to cool various components within the storage device (block 970). In a number of embodiments, this cooling is accomplished through the use of a TEC energy recycling module. In certain embodiments, the energy recycling module may have been switched to a cooling mode from a capture mode.

Figure 10:
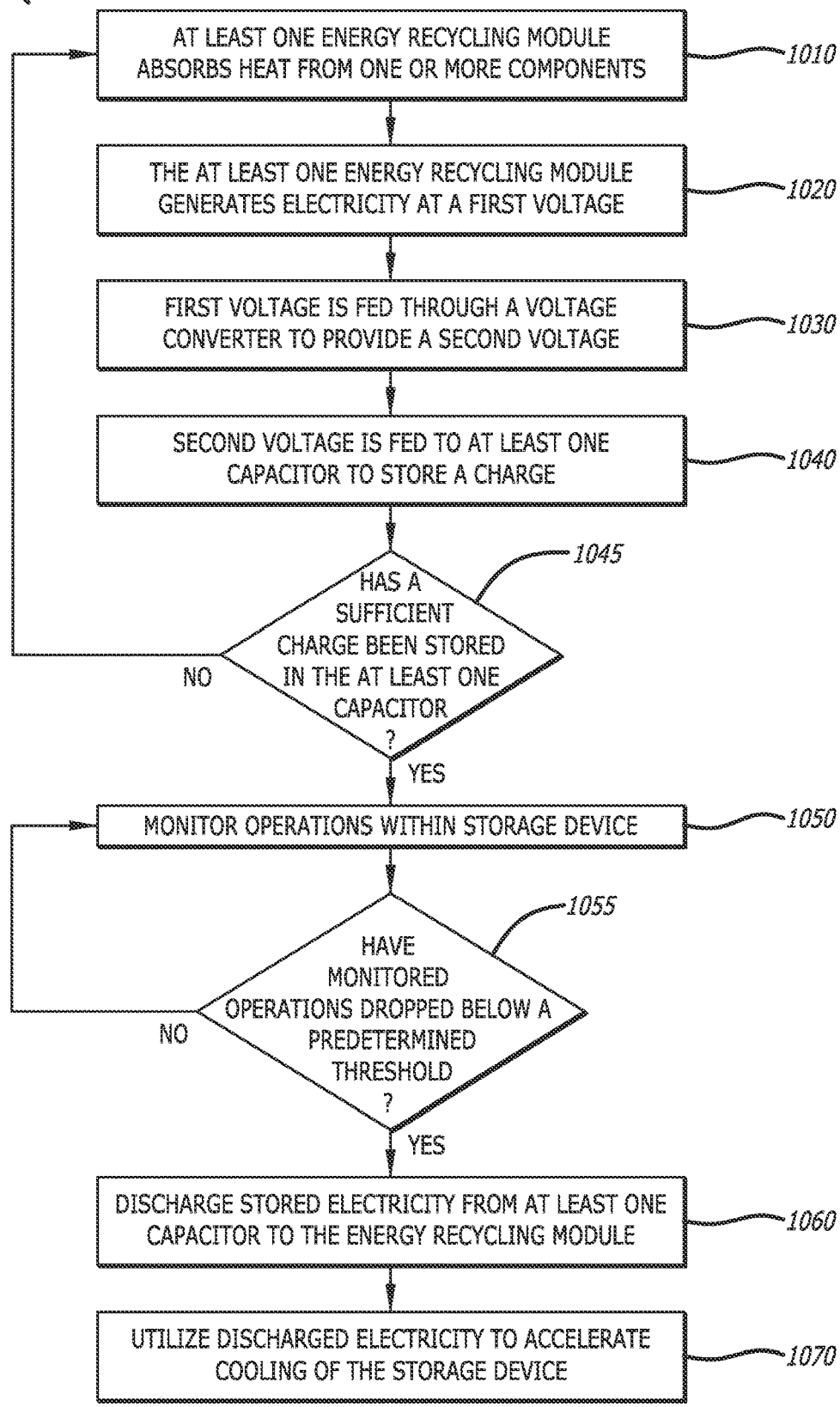
FIG. 10 is a flowchart depicting a process for discharging recycled electricity to accelerate cooling within a storage device in accordance with an embodiment of the disclosure.

Referring to FIG. 10, a flowchart depicting a process for discharging recycled electricity to accelerate cooling within a storage device in accordance with an embodiment of the disclosure is shown. In a number of embodiments, a storage device comprises at least one energy recycling module to absorb heat from one or more components within the storage device (block 1010). The energy recycling module(s) can be configured to generate electricity at a first voltage (block 1020). In certain embodiments, the first voltage generated can vary between different amounts in response, for example, from variations within the amount of heat captured from the various storage device components. However, the first voltage may not be useful or compatible with various power-storing components.

In additional embodiments, the process 1000 can direct the first voltage to a voltage converter configured to provide a second voltage (block 1030). As previously discussed, the one or more power-storing components may be configured to accept a specific voltage that is not compatible with one or more energy recycling modules. In these cases, the process 1000 can utilize a voltage converter, such as, but not limited to, a buck-boost converter, to convert the first voltage into a second voltage. That second voltage can be directed to at least one capacitor to store a charge (block 1040). The capacitor can be configured to accept the second voltage to store a charge. In response, the capacitor acts as a power-storing component to store a charge until later needed. In many embodiments, at least one capacitor is stored within the storage device. However, in further embodiments, the capacitor can be configured to be a part of a storage system that serves and is connected with a plurality of storage devices.

During operation, the process 1000 can determine if a sufficient charge has been stored within the at least one capacitor (block 1045). If there is not a specific level of desired charge, the process 1000 can continue to absorb heat from the one or more components and generate recycled electricity (block 1010). Upon determining that a sufficient charge has been stored, the process 1000 can monitor various operations within the storage device (block 1050). During this monitoring, the process 1000 can then determine if the monitored operations have dropped below a predetermined threshold (block 1055). As previously discussed, storage devices may operate under periods of high usage followed by periods of low usage. During high usage, excess heat is generated in greater quantity, which can be captured and recycled. Subsequently, during low usage periods, the storage device will begin to naturally cool off, which can be accelerated. In additional embodiments, the determination may instead examine one or more temperature-related thresholds. If the monitored operations have not fallen below the predetermined threshold, the process 1000 can continue to monitor various operations (block 1050).

However, when the monitored operations do fall below a predetermined threshold, the process 1000 can discharge the stored electricity from at least one capacitor to at least one energy recycling module (block 1060). As previously stated, the one or more energy recycling modules can be manufactured and/or configured as a TEC. In a variety of embodiments, these TEC energy recycling modules can utilize this discharged electricity to accelerate the cooling of the storage device (block 1070). In a variety of embodiments, the power provided to the TEC components can allow them to operate for a period of time equal to bring the storage device down to a predetermined baseline temperature. This predetermined temperature can be the idle temperature or may be a threshold temperature set by the manufacturer, or the system administrator. In this way, storage devices can more quickly cool down to a baseline or acceptable temperature, leading to increased component and device lifespans while also reducing costs associated with keeping the storage device and/or system within a safe operating temperature.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A storage device comprising:
    a plurality of components including:
        a processor; and
        a memory array comprising a plurality of memory devices;
    a first energy recycling module, wherein the first energy recycling module is disposed on a top of one or more of the components; and
    an accelerated cooling logic configured to:
        enable the first energy recycling module to capture heat generated from the one or more of the components;
        convert the captured heat into an amount of electricity;
        store the converted amount of electricity within the storage device;
        receive a signal associated with a decrease in operations of the components within the storage device; and
        utilize, in response to the received signal, the stored amount of electricity is utilized to accelerate cooling of the components within the storage device.

2. The storage device of claim 1, wherein the accelerated cooling logic is further configured to:
    determine the operations of the components being performed within the storage device; and generate the signal in response to the operations of the components falling below a predetermined threshold.

3. The storage device of claim 1, wherein the stored amount of electricity is utilized to power a second energy recycling module.

4. The storage device of claim 3, wherein the second energy recycling module is configured to cool another one or more of the components in response to receiving at least a portion of the amount of the electricity.

5. The storage device of claim 4, wherein the second energy recycling module utilizes the Peltier effect to cool the another one or more of the components.

6. The storage device of claim 4, wherein the stored amount of electricity is further utilized to power the first energy recycling module.

7. The storage device of claim 6, further comprises a temperature sensor.

8. The storage device of claim 7, wherein the second energy recycling module is configured to:
 convert captured heat of the another one or more of the components; and
 accelerate the cooling of the the another one or more components upon a threshold of a temperature being exceeded, wherein the temperature is detected through the temperature sensor.

9. The storage device of claim 1, wherein the first energy recycling module is disposed on a top of the processor.

10. The storage device of claim 1, wherein the first energy recycling module is disposed on a top of at least a portion of the memory array.

11. The storage device of claim 1, further includes a casing that encloses the plurality of components.

12. The storage device of claim 11, wherein the first energy recycling module is integrated into the casing.

13. The storage device of claim 11, wherein the first energy recycling module is encased within the casing with others of the plurality of components.

14. The storage device of claim 1, wherein the plurality of components further include one or more capacitors, the converted amount of electricity is stored in the one or more capacitors.

15. The storage device of claim 1, wherein the first energy recycling module comprises two or more energy recycling modules each configured to both convert the heat to the amount of electricity and to accelerate the cooling in response to in response to the received signal of the decrease in operations.

16. The storage device of claim 15, wherein each of the two or more energy recycling modules operates based on temperature differences in a respective zone within the storage device.

17. A storage system comprising:
 a plurality of storage devices, each of the storage devices comprises a plurality of components including at least:
  a processor; and
  a memory array comprising a plurality of memory devices;
 at least one energy recycling module disposed on each of the storage devices; and
 an accelerated cooling logic configured to:
  enable the at least one energy recycling module to capture heat generated from one or more of the components;
  convert the captured heat into an amount of electricity;
  store the converted amount of electricity within a respective one of the storage devices;
  communicate with at least one other of the storage devices within the storage system;
  receive a signal associated with a decrease in operations of the components of within the at least one other of the storage devices within the storage system; and
  utilize, in response to the received signal, the stored amount of electricity is utilized to accelerate cooling of the components of the at least one other of the storage devices within the storage system.

18. A method for recycling energy within a storage device, comprising:
 providing a plurality of components of the storage device including:
  a processor; and
  a memory array comprising a plurality of memory devices;
 providing an energy recycling module disposed of the storage device on one or more of the components of the storage device;
 enabling the energy recycling module to capture heat generated from the one or more of the components;
 converting the captured heat into an amount of electricity;
 storing the converted amount of electricity within the storage device;
 receiving a signal associated with a decrease in operations of the components within the storage device; and
 utilizing, in response to the received signal, the stored amount of electricity is utilized to accelerate cooling of the components within the storage device.

19. The method of claim 18, wherein the energy recycling module operates alternately as a thermo-electric cooler and a thermo-electric generator.

20. The method of claim 19, wherein the thermo-electric cooler utilizes the Peltier effect and the thermo-electric generator utilizes the Seebeck effect.

* * * * *